(12) United States Patent
Cui et al.

(10) Patent No.: US 6,869,806 B2
(45) Date of Patent: Mar. 22, 2005

(54) METHOD AND APPARATUS FOR THE PRODUCTION OF A SEMICONDUCTOR COMPATIBLE FERROMAGNETIC FILM

(75) Inventors: Yongjie Cui, Evanston, IL (US); Lian Li, Milwaukee, WI (US)

(73) Assignee: WiSys Technology Foundation, Inc., Madison, WI (US)

( * ) Notice: Subject to any disclaimer, the term of this patent is extended or adjusted under 35 U.S.C. 154(b) by 0 days.

(21) Appl. No.: 10/468,720

(22) PCT Filed: Mar. 14, 2003

(86) PCT No.: PCT/US03/07951

§ 371 (c)(1),
(2), (4) Date: Aug. 21, 2003

(87) PCT Pub. No.: WO03/078701

PCT Pub. Date: Sep. 25, 2002

(65) Prior Publication Data

US 2004/0072425 A1 Apr. 15, 2004

Related U.S. Application Data

(60) Provisional application No. 60/364,989, filed on Mar. 14, 2002.

(51) Int. Cl.[7] .............................................. H01L 21/00
(52) U.S. Cl. ............................. 438/3; 438/22; 438/34; 438/44
(58) Field of Search ..................... 438/22–28, 34–39, 438/44, 3

(56) References Cited

U.S. PATENT DOCUMENTS

| | | | |
|---|---|---|---|
| 5,173,443 A | 12/1992 | Biricik et al. | |
| 5,210,051 A | * 5/1993 | Carter, Jr. .................... | 438/22 |
| 6,593,016 B1 | 7/2003 | Chiyo et al. | |
| 6,679,947 B2 | * 1/2004 | Nagai et al. ................. | 117/97 |
| 6,686,205 B1 | 2/2004 | Schultz et al. | |
| 6,753,245 B2 | 6/2004 | Choi | |
| 2002/0110945 A1 | * 8/2002 | Kuramata et al. ............ | 438/36 |
| 2003/0230753 A1 | * 12/2003 | Steckl et al. .................. | 257/89 |

OTHER PUBLICATIONS

S. Kuwabara, K. Ishii, S. Haneda, T. Kondo, H. Munekata "Preparation of wurtzite GaN–based magnetic alloy semiconductors by molecular beam epitaxy". Physica E, 2001, pp. 233–236.*

Theodoropoulous N. et al: "Magnetic and structural properties of Mn—implanted GaN" Applied Physics Letters, American Institute of Physics, New York, US, vol. 78, No. 22, 28 May 200, pp. 3475–3477; XP001153347; ISSN: 0003–6951.

Zajac M et al: "Paramagnetism and antiferromagnetism d–d coupling in GaMnN magnetic semiconductor" Applied Letters, American Institute of Physics, New York, US, vol. 79, No. 15, Oct. 8, 2001, pp. 2432–2434; XP001153348; ISSN: 0003–6951.

Reed M L et al: "Room Temperature Ferromagnetic Properties of (GA, MN)N" Applied Physics Letters, American Institute of Physics, New York, US, vol. 79, No. 21, Nov. 19, 2001, pp. 3473–3475; XP001103384; ISSN: 0003–6951.

Cui Y et al: "Suppression of Phase Segregation During Molecular—Beam Epitaxial Growth of Gamnn Using Nitrogen–Hydrogen Plasma" Applied Physics Letters, American Institute of Physics, New York, US, vol. 80, No. 22, Jun. 3, 2002, pp. 4139–4141; XP001122680, ISSN: 0003–6951.

(List continued on next page.)

*Primary Examiner*—Caridad Everhart
*Assistant Examiner*—Renzo N. Rocchegiani
(74) *Attorney, Agent, or Firm*—Quarles & Brady LLP

(57) ABSTRACT

Films of gallium manganese nitride are grown on a substrate by molecular beam epitaxy using solid source gallium and manganese and a nitrogen plasma. Hydrogen added to the plasma provides improved uniformity to the film which may be useful in spin-based electronics.

18 Claims, 3 Drawing Sheets

OTHER PUBLICATIONS

Sonoda S et al: "Properties of Ferromagnetic GA1–XMNXN Films Grown by Ammonia–MBE" IEEE Transactions on Magnetics, IEEE Inc., New York, US, vol. 38, No. 5, Sep. 5, 2002, pp. 2859–2862; XP001131715; ISSN: 0018–9464.

T. Dietl, et al., Zener Model Description of Ferromagnetism in Zinc–Blende Magnetic Semiconductors, SCIENCE–vol. 287, Feb. 11, 2000.

G. Schmidt, et al., Fundamental Obstacle for Electrical Spin Injection from a Ferromagnetic Metal into a Diffusive Semiconductor, The American Physical Society, 2000.

S.A. Wolf, et al., Spintronics: A Spin–Based Electronics Vision for the Future, SCIENCE vol. 294, Nov. 16, 2001.

U.L. Soo, et al., Local Structure and Chemical Valency of Mn Impurities in Wide–Band–Gap III–V Magnetic Alloy Semiconductors Ga1–xMnxN, Applied Physics Letters, vol. 79, No. 24, Dec. 10, 2001.

M.L. Reed, Room Temperatur Magnetic (Ga,Mn)N: a New Material for Spin Electronic Devices, Materials Letters 51 (2001) 500–503.

USPTO Office Action dated Nov. 12, 2004.

* cited by examiner

METHOD AND APPARATUS FOR THE PRODUCTION OF A SEMICONDUCTOR COMPATIBLE FERROMAGNETIC FILM

CROSS-REFERENCE TO RELATED APPLICATIONS

This application is based on provisional application 60/364,989 filed Mar. 14, 2002 and entitled "Method and Apparatus for the Production of a Semiconductor Compatible Ferromagnetic Film" and claims the benefit thereof. This application is a 371 PCT/US03/07951 Mar. 14, 2003.

STATEMENT REGARDING FEDERALLY SPONSORED RESEARCH OR DEVELOPMENT

BACKGROUND OF THE INVENTION

Most present-day, electronic, semiconductor devices measure and manipulate electron charge. Recently, however, there has been considerable interest in semiconductor devices that measure and manipulate the spin of electrons, either alone or in conjunction with electron charges.

A number of devices are envisioned using electron spin, including Spin-FETs (Field Effect Transistors), Spin-LEDs (Light Emitting Diodes) and Spin-RTDs (Resonant Tunneling Devices), optical switches, modulators, encoders, decoders and quantum bits for quantum computation and communication. An overview of electronic devices based on electron spin is provided in S. A. Wolf, et. al., "Spintronics: A Spin-Based Electronics Vision for the Future", Science, Vol. 294, pps. 1488–1495, (November 2001).

Ferromagnetic semiconductors such as GaMnAs and InMnAs are possible candidates for the ferromagnetic film that may be used in electron spin devices. Unfortunately, to date, the highest Curie temperature (the temperature beyond which ferromagnetic properties disappear) for GaMnAs is 110K which is too low for routine semiconductor device applications.

Gallium nitride, p-doped with five percent manganese, has been predicted to have a Curie temperature above room temperature. However, this concentration of five percent is several orders of magnitude higher than the solubility limit of manganese in gallium nitride. The low solubility results in the formation of stable secondary phases, such as GaMn and $Mn_3N_2$. Recently, there have been reports of ferromagnetic ordering in gallium nitride n-doped with manganese. Nevertheless, phase segregation is still a problem.

In such phase segregation, the manganese migrates into strips and clusters in the film leaving the remaining areas depleted of manganese. An inability to provide for a uniform film is an obstacle to the production of electronic devices described above.

Current investigations in the growth of GaMnN use low temperature molecular beam epitaxy to suppress the formation of intermediate compounds such as $Mn_3N_2$ and GaMn.

BRIEF SUMMARY OF THE INVENTION

The present inventors have determined that the introduction of controlled amounts of hydrogen into a nitrogen plasma used during molecular beam epitaxy substantially suppresses phase segregation and produces a highly homogenous thin film that may be better suited for electronic devices.

The mechanism as to why phase segregation is suppressed is not clear at the moment. Previous studies have shown that hydrogen can enhance the growth rate of AlN and GaN, as well as the incorporation of indium in GaN, by increasing the number of reactive nitrogen species.

In the following description, reference is made to the accompanying drawings which form a part hereof, and in which there is shown by way of illustration, a preferred embodiment of the invention. Such embodiment also does not define the scope of the invention and reference must be made therefore to the claims for this purpose.

DETAILED DESCRIPTION OF THE PREFERRED EMBODIMENT

Figure 1:
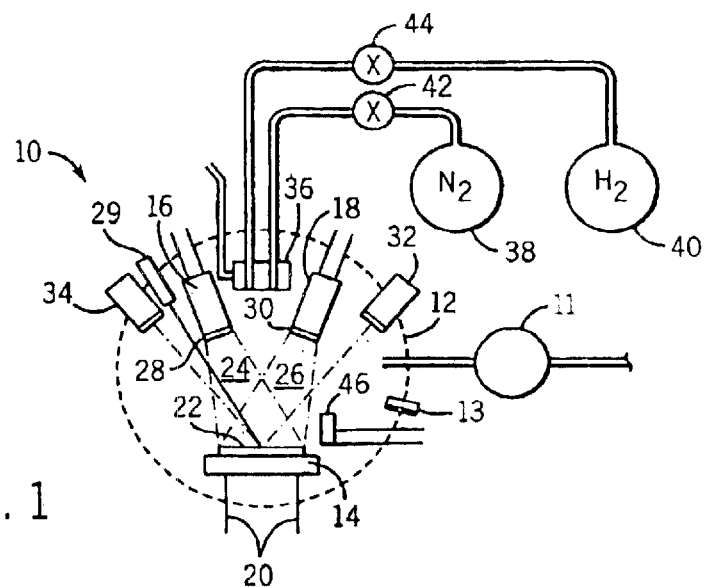
FIG. 1 is a simplified schematic representation of a molecular beam epitaxy chamber used in the present invention.

Referring now to FIG. 1, the present invention employs the technique of molecular beam epitaxy such as employs a vacuum chamber 10 suitable for providing an ultra-high vacuum within chamber region 12 by means of a multi-stage vacuum pump 11, of a type well-known in the art. A vacuum gauge 13 allows control of the vacuum within the chamber region 12 to a predetermined desired setting.

Positioned within the chamber region 12 is a wafer carrier 14 that may hold a wafer 22 as will be described and which provides electrical leads 20 for resistive heating of the wafer 22.

The wafer carrier 14 is positioned opposite to a gallium effusion cell 16 that may produce a gallium beam 24 and manganese effusion cell 18 produces a manganese beam 26, each directed along an unobstructed path to wafer 22. As is understood in the art, the effusion cells 16 and 18 include an internal temperature controlled oven (holding a gallium or manganese source, respectively) and a front shutter 28 and 30 that may be opened or closed to control the gallium beam 24 and manganese beam 26.

The chamber region 12 may receive set volume-rate streams of nitrogen 38 or hydrogen 40 as controlled by metering devices 42 and 44, respectively, of a type well known in the art. The streams of gas are received by an electron cyclotron resonance (ECR) plasma source 36, converting the streams to a plasma state. The ECR plasma source 36 is an MPDR 610i device commercially available from Wavemat, Inc. of Plymouth, Mich.

Positioned within the chamber region 12, approximately two centimeters from the wafer 22, is a silicon wafer 46 that may be heated resistively to produce a silicon vapor as will be described.

The vacuum chamber 10 provides ports 29, 32 and 34 aligned with the wafer carrier 14 allowing observation of the wafer 22 during the molecular beam epitaxy and monitoring of the wafer 22 using a reflection high-energy electron diffraction device (RHEED) and an infrared pyrometer (not shown).

The method of the present invention employs wafer 22 as a substrate for epitaxial growth of a GaMnN film. The wafer 22 is preferably a silicon carbide wafer with hexagonal structure (6H—SiC(0001)) nitrogen doped with a dopant concentration of approximately $10^{18}$ nitrogen atoms per cubic centimeter as obtained from Cree Research, Inc. of Durham, N.C. Other substrates may also be used including sapphire.

Figure 2:
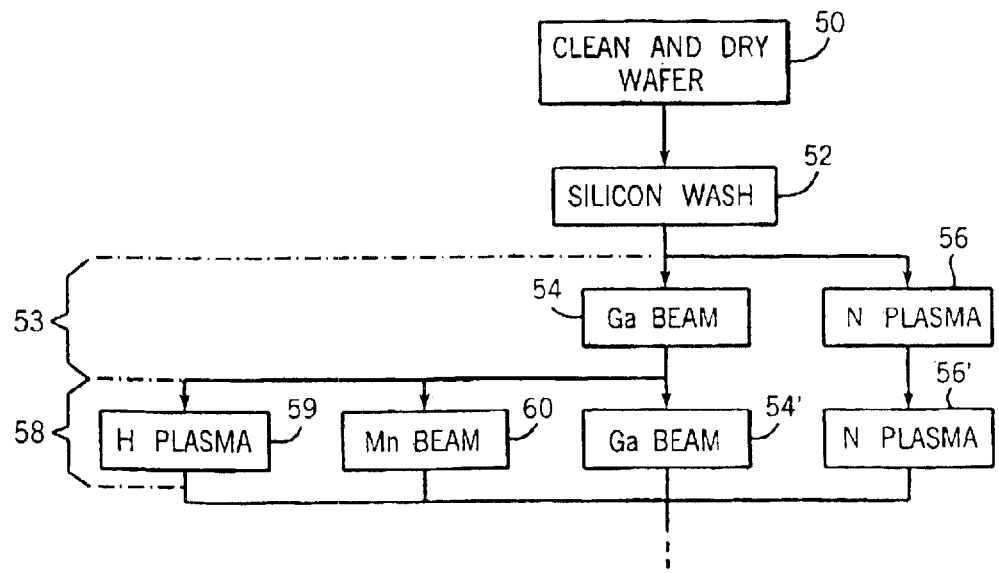
FIG. 2 is a flow chart of the process of the present invention using the apparatus of FIG. 1 and providing for gallium and manganese molecular beams directed toward a substrate in the presence of a nitrogen plasma to form a GaMnN film on the substrate.

Referring now also to FIG. 2, at process block 50, the wafer 22 is cleaned with acetone and methanol, and then dried with flowing nitrogen first, then it is introduced into vacuum chamber 10 and placed in the wafer carrier 14 where it is resistively heated it to 850–950 degrees centigrade by a direct current through the wafer 22. During the heating of the wafer 22, the pressure of the chamber region 12 is reduced to approximately $1 \times 10^{-9}$ Torr.

As indicated by process block 52, at a next step, a flux of silicon vapor generated by heating the silicon wafer 46 is directed over the wafer 22. The silicon atoms of the vapor react to the $SiO_2$ of the wafer 22 and produce a 3×3 reconstruction of the silicon-rich surface of the wafer 22 as may be observed by RHEED and as has been subsequently verified with a scanning tunnel microscope (STM).

As indicated by process blocks 54 and 56, during buffer layer formation stage 53, a layer of gallium nitride is grown on the surface of the wafer 22 to a thickness of approximately 80 nanometers, at a growth rate of forty nanometers per hour. First, the gallium within the gallium effusion cell 16 is raised to a temperature of 950 degrees centigrade. Then, as indicated by process block 56, nitrogen is introduced at a flow rate of six standard cubic centimeters per minute (sccm) and reactive nitrogen species are generated by the plasma source 36 operating at a power of 30 watts. The temperature of the wafer 22 is brought to approximately 500 degrees centigrade and the total pressure in the chamber region adjusted to $1 \times 10^{-4}$ Torr. Finally, as indicated by process block 54, the shutter 28 of the gallium effusion cell 16 is opened so that a beam 24 of gallium passes through reactive nitrogen species and is deposited on the wafer 22 as gallium nitride.

With sapphire, before the gallium nitride buffer layer is formed, an aluminum nitride layer of less than two nanometers is formed by treating the sapphire surface with nitrogen plasma for thirty minutes while the sapphire is heated to 850 degrees C.

After completion of buffer layer of GaN at buffer layer formation stage 53, a layer of GaMnN is deposited as indicated by process blocks 59, 60, 54' and 56' during a GaMnN layer formation stage 58. Generally, no change is made in the gallium beam 24 or the flow of nitrogen indicated now by process blocks 54' and 56'. However, at process block 59, hydrogen 40 is introduced into the chamber regions 12 through the plasma source 36 at a flow rate of two sccm to generate hydrogen reactive species. The manganese within the manganese effusion cell 18 is raised to a temperature of between 750 and 880 degrees, and the shutter 30 opened so that a beam 26 of manganese passes through the reactive nitrogen and hydrogen species to deposit on the wafer 22 a layer of GaMnN. Growth of the GaMnN layer is monitored by RHEED. A thickness of 200 nanometers may be achieved at a growth rate of 50 nanometers per hour.

EXAMPLE I

Figure 3:
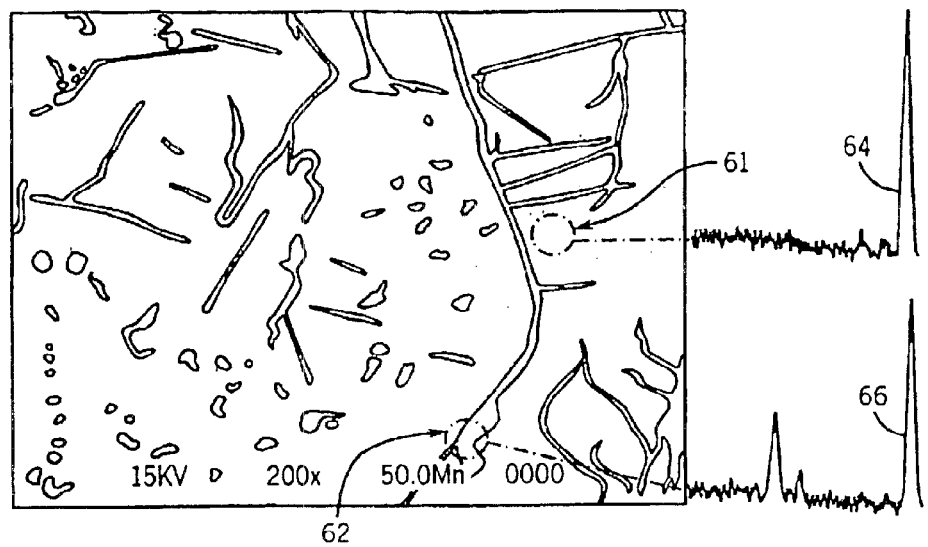
FIG. 3 is a scanning electron micrograph of a GaMnN film deposited using molecular beam epitaxy without the addition of hydrogen to the nitrogen plasma showing severe phase segregation.

Referring now to FIG. 3, a scanning electron micrograph image of GaMnN film using the above-described technique, but without the introduction of the hydrogen per process block 59, shows a surface characterized by two distinct domains 61 and 62. Domain 61 is part of a flat terrace and the domain 62 is located on one of a set of randomly distributed strips and clusters.

Analysis of energy dispersive spectroscopy (EDS) spectra 64 and 66 for domains 61 and 62, respectively, indicate that terrace domains 61 contain no manganese, while high concentrations of manganese, more than forty percent, are found in the strips and clusters domain 62. Manganese content was calculated using the $K_\alpha$ peak ratios between Mn and Ga. Since the x-ray has an escape length larger than 1 $\mu$m, the Mn concentration obtained is a good indication of its composition in the film. Scanning tunneling microscope pictures of domain 60 indicate spiral mounds characteristic of GaN films grown under gallium-rich conditions. X-ray diffraction studies of the films indicate the preferential formation of a second phase $Mn_3N_2$. The population and size of the clusters and strips increases with increasing manganese effusion cell temperatures suggesting they are related to manganese. These observations indicate that the film grown has phase segregated into two phases GaN and secondary phases that contain Mn. The preferential formation of secondary phases such as $Mn_3N_2$ has been confirmed with X-ray diffraction (XRD) studies.

EXAMPLE II

Figure 4:
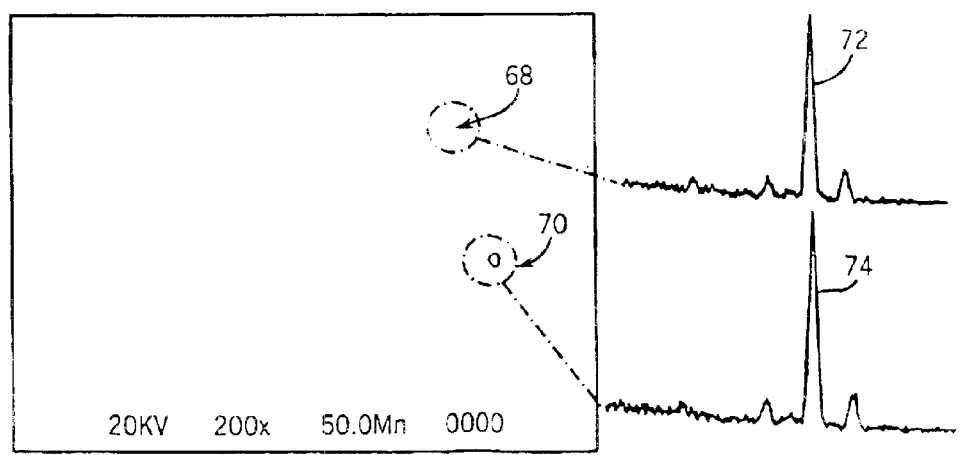
FIG. 4 is a figure similar to that of FIG. 3 showing improved uniformity in the GaMnN film with the addition of hydrogen to the nitrogen plasma.

Referring now to FIG. 4, a scanning electron micrograph image of GaMnN film using the above-described technique including the introduction of hydrogen per process block 59, shows a far more homogenous surface including larger terrace domains 68 and few cluster domains 70. Energy dispersive spectroscopy spectra taken in the domains 68 and 70 indicate a uniform 6.7% manganese concentration in the film. On the other hand, a slightly lower Mn concentration is found for the clusters of domain 70, indicating that these clusters of domain 70 are different from the clusters of domain 62 observed for the pure nitrogen growth.

Figure 5:
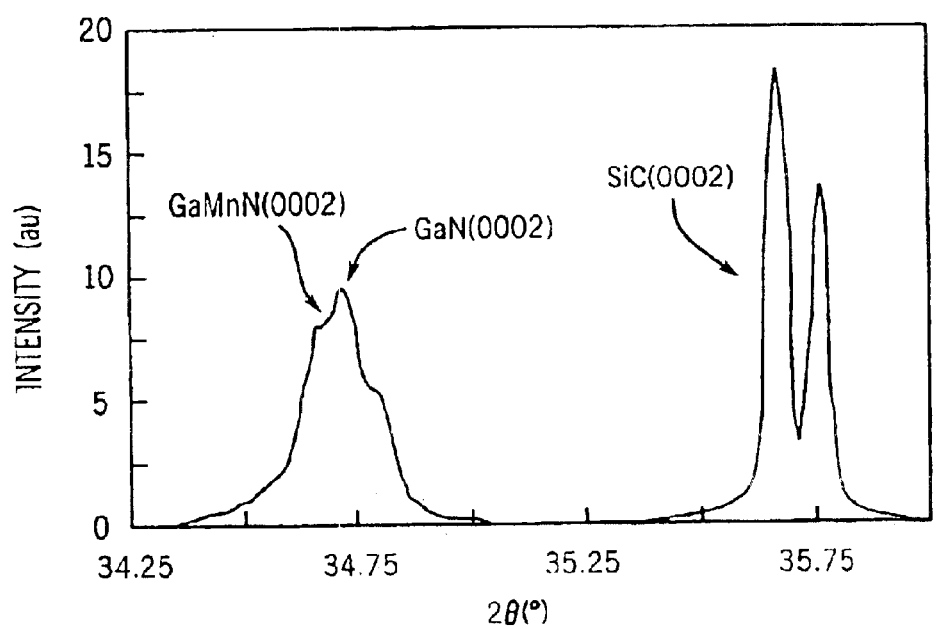
FIG. 5 is an x-ray diffraction spectrum suggesting the existence of only a single phase in the GaMnN film of FIG. 4.

Referring now to FIG. 5, x-ray diffraction (XRD) was used to assess the crystallinity and structure of the GaMnN film of Example 2. A single phase GaMnN was detected with no secondary phase formation. The shown XRD spectra is for a $Ga_{1-x}Mn_xN$ film with x=0.06. Two peaks are evident located at 34.65 and 34.71 degrees, with a separation of 216 arc seconds. The 34.71 degree peak belongs to the GaN (0002) reflection and is caused by the 80 nm thick buffer layer; while the peak at 34.65 degrees is due to the GaMnN film. These results clearly show that single phase GaMnN containing about 6.0% Mn has been grown by MBE using $N_2/H_2$ plasma Note, in FIG. 5, the second substrate peak at 35.8 degrees and the shoulders at 34.8 degrees are due to the $K_{\alpha 2}$ emission of the x-ray source.

These results clearly show that single-phase gallium manganese nitride containing more that six percent of manganese can be grown by molecular beam epitaxy using the present invention. Films grown without the presence of hydrogen are phase segregated into GaN and manganese containing alloys, while single phase $Ga_{1-x}Mn_xN$, films with x as high as 0.06, is obtained for films grown with nitrogen-hydrogen plasma.

It is specifically intended that the present invention not be limited to the embodiments and illustrations contained herein, but that modified forms of those embodiments including portions of the embodiments and combinations of elements of different embodiments also be included as come within the scope of the following claims.

We claim:

1. A method for the manufacture of a gallium manganese nitride film comprising the steps of:
   (a) preparing a substrate for molecular beam epitaxy; and
   (b) applying gallium and manganese to the substrate using molecular beam epitaxy in the presence of a nitrogen and hydrogen reactive species.

2. The method of claim 1 wherein the gallium is applied by a gallium effusion cell directed at the substrate.

3. The method of claim 1 wherein the manganese is applied by a manganese effusion cell directed at the substrate.

4. The method of claim 1 wherein the nitrogen and hydrogen reactive species are produced by nitrogen and hydrogen gas excited to a plasma state.

5. The method of claim 4 wherein a flow of the plasma is directed at the substrate.

6. The method of claim 1 wherein the substrate is silicon carbide.

7. The method of claim 6 wherein the silicon carbide is hexagonal.

8. The method of claim 1 wherein the substrate is sapphire.

9. The method of claim 1 wherein prior to step (b) the substrate is heated in a vacuum to greater than 800 degrees C.

10. The method of claim 1 wherein the substrate is sapphire and wherein prior to step (b), the substrate is treated with nitrogen plasma to form an aluminum nitride layer.

11. The method of claim 1 wherein prior to step (b), a buffer layer of gallium nitride is formed on the surface of the substrate.

12. The method of claim 11 wherein the buffer layer is grown by molecular beam epitaxy of gallium in the presence of nitrogen.

13. The method of claim 12 wherein the nitrogen is in plasma state.

14. The method of claim 13 wherein the molecular beam of gallium intersects a flow of nitrogen plasma both directed at the substrate.

15. The method of claim 14 wherein the substrate is brought to a temperature of greater than 500 degrees C. during the growth of the buffer layer.

16. The method of claim 1 wherein the substrate is brought to a temperature of greater than 500 degrees C. during the time of growth of the gallium maganese nitride film.

17. The method of claim 1 wherein the molecular beam epitaxy of gallium and manganese uses solid source gallium and manganese.

18. A method for the manufacture of a gallium manganese nitride film comprising the steps of:
   (a) preparing a substrate for molecular beam epitaxy; and
   (b) applying gallium and manganese to the substrate using molecule beam epitaxy in the presence of a nitrogen and hydrogen reactive species wherein the substrate is silicon carbide and wherein prior to step (b), the silicon carbide substrate is treated with silicon vapor to remove $SiO_2$ and to reconstruct a silicon rich surface.

* * * * *

UNITED STATES PATENT AND TRADEMARK OFFICE
CERTIFICATE OF CORRECTION

PATENT NO. : 6,869,806 B2
DATED : March 22, 2005
INVENTOR(S) : Cui et al.

It is certified that error appears in the above-identified patent and that said Letters Patent is hereby corrected as shown below:

Column 1,
Line 15, under heading "STATEMENT REGARDING FEDERALLY SPONSORED RESEARCH OR DEVELOPMENT", insert -- This invention was made with United States government support awarded by the following agencies: NSF DMR-0094105. The United States has certain rights in this invention. --

Column 6,
Line 17, "maganese" should be -- manganeses --.
Line 26, "molecule" should be -- molecular --.

Signed and Sealed this

Fourteenth Day of June, 2005

JON W. DUDAS
*Director of the United States Patent and Trademark Office*

UNITED STATES PATENT AND TRADEMARK OFFICE
CERTIFICATE OF CORRECTION

PATENT NO. : 6,869,806 B2
DATED : March 22, 2005
INVENTOR(S) : Cui et al.

It is certified that error appears in the above-identified patent and that said Letters Patent is hereby corrected as shown below:

Column 1,
Line 15, under heading "STATEMENT REGARDING FEDERALLY SPONSORED RESEARCH OR DEVELOPMENT", insert -- This invention was made with United States government support awarded by the following agencies: NSF DMR-0094105. The United States has certain rights in this invention. --

Column 6,
Line 17, "maganese" should be -- manganese --.
Line 26, "molecule" should be -- molecular --.

This certificate supersedes Certificate of Correction issued June 14, 2005.

Signed and Sealed this

Second Day of August, 2005

JON W. DUDAS
*Director of the United States Patent and Trademark Office*